United States Patent
Ootsuka

(10) Patent No.: US 8,258,888 B2
(45) Date of Patent: Sep. 4, 2012

(54) SUBSTRATE DEVICE WITH A TRANSMISSION LINE CONNECTED TO A CONNECTOR PAD AND METHOD OF MANUFACTURE

(75) Inventor: Hidetaka Ootsuka, Tokyo (JP)

(73) Assignee: NEC Corporation, Tokyo (JP)

( * ) Notice: Subject to any disclaimer, the term of this patent is extended or adjusted under 35 U.S.C. 154(b) by 227 days.

(21) Appl. No.: 12/588,731

(22) Filed: Oct. 26, 2009

(65) Prior Publication Data

US 2010/0103636 A1 Apr. 29, 2010

(30) Foreign Application Priority Data

Oct. 27, 2008 (JP) ................................ 2008-275509

(51) Int. Cl.
*H01P 5/02* (2006.01)
(52) U.S. Cl. .......................................... 333/33; 333/246
(58) Field of Classification Search ................ 333/246, 333/260, 33
See application file for complete search history.

(56) References Cited

U.S. PATENT DOCUMENTS

| | | | | |
|---|---|---|---|---|
| 2,983,884 A | * | 5/1961 | Rueger ............................ | 333/33 |
| 4,837,529 A | * | 6/1989 | Gawronski et al. ............. | 333/33 |
| 5,757,252 A | * | 5/1998 | Cho et al. ....................... | 333/246 |
| 6,362,703 B1 | * | 3/2002 | Keesey et al. ................... | 333/33 |
| 6,803,836 B2 | * | 10/2004 | Estes et al. ...................... | 333/34 |
| 2005/0017827 A1 | * | 1/2005 | Hsu ................................. | 333/246 |

FOREIGN PATENT DOCUMENTS

| | | |
|---|---|---|
| JP | 4-276905 A | 10/1992 |
| JP | 10-145114 A | 5/1998 |
| JP | 2004-39732 A | 2/2004 |
| JP | 2005-9445 A | 4/2005 |
| JP | 2008-46142 | 2/2008 |

OTHER PUBLICATIONS

Japanese Office Action dated Oct. 8, 2010, with English translation.

* cited by examiner

*Primary Examiner* — Benny Lee
(74) *Attorney, Agent, or Firm* — McGinn IP Law Group, PLLC

(57) ABSTRACT

A substrate device includes: a substrate; a ground layer disposed on one of two opposing surfaces of the substrate; a transmission line disposed on the other of the two opposing surfaces of the substrate; a pad which is disposed on the other of the two opposing surfaces of the substrate and connected to the transmission line; and a connector connected to the pad via a contact point. The pad has a part on the transmission line side and a part positioned on the opposite side of the transmission line with respect to the contact point with the connector which are electrically insulated from each other.

4 Claims, 8 Drawing Sheets

RELATED ART

RELATED ART

SUBSTRATE DEVICE WITH A TRANSMISSION LINE CONNECTED TO A CONNECTOR PAD AND METHOD OF MANUFACTURE

TECHNICAL FIELD

The present invention relates to a substrate device and its manufacturing method and, more particularly, to a substrate device having a pad structure for an edge connector provided at the end of a printed board and a manufacturing method of such a substrate device.

BACKGROUND ART

A connection structure of a substrate device of the related art will be described with reference to FIG. 8.

Referring to FIG. 8, a transmission line 12 serving as a signal line is mounted on a printed board 11. The transmission line 12 is connected to a pad 13 for an edge connector 16 at the end of the board. The pad 13 and edge connector 16 are connected to each other at a contact point 14. A transmission signal is transmitted from the transmission line 12 to the edge connector 16 via the pad 13 and contact point 14, or transmitted in the reverse direction from the edge connector 16 to the transmission line 12 via the contact point 14 and pad 13.

The pad 13 for the edge connector 16 provided at the end of the printed board 11 needs to be designed such that it has a diameter larger than the contact point 14 in terms of manufacturing requirements. Thus, for a high-speed signal, the part of the pad 13 that is positioned on the opposite side of the transmission line 12 with respect to the contact point 14 is a wiring branched from the transmission line 12. This wiring is fundamentally unnecessary for signal transmission and is called "stub" (stub 15). The leading end of the stub 15 is not connected anywhere and is opened, so that a signal branched from the transmission line 12 is reflected at the open end to become noise. Particularly, in high-speed signal transmission, this portion may be a source of noise, resulting in degradation of signal quality (signal waveform).

The stub 15 is coupled to a ground layer 17 positioned at the lower layer of the printed board 11 to have capacitance, so that a capacitance component fundamentally unnecessary for the transmission line 12 is added thereto. This may cause impedance mismatch, leading to reflection noise. Particularly, in high-speed signal transmission, influence of the reflection noise becomes large relative to the noise margin of a signal in the voltage axis direction and time axis direction, making it difficult to secure the eye pattern in a signal waveform.

In relation to the above problem, JP-A-2008-046142 has proposed a multilayer printed board for mounting device to be measured in which a through hole is used to connect an electrode pad and inner layer wiring pattern. In this printed board, for achievement of high speed signal transmission, an SVH (Surface Buried Via Hole) is formed in one of both ends of an inner layer wiring pattern to accordingly shorten the length of a stub portion in a through hole to thereby reduce a stub capacitance.

In the technique of JP-A-2008-046142, the removal of the stub in the through hole is mechanically conducted by drilling from the back surface of the printed board, since the through hole can be formed only in a columnar shape in terms of manufacturing constraint.

On the other hand, in the case of the pad 13 for the edge connector 16 positioned at the end of the printed board 11 of FIG. 8, when the removal of the stub is mechanically conducted by drilling as in JP-A-2008-046142, a burr may remain in the pad 13, degrading reliability of connection with the contact point 14.

The present invention has been made to solve the above problems, and an object thereof is to provide a substrate device capable of reducing reflection noise from the stub end of the pad to reduce degradation of a signal waveform and improving impedance mismatch caused due to a capacitance between the pad stub and ground layer.

SUMMARY OF THE INVENTION

To solve the above object, according to an aspect of the present invention, there is provided a substrate device including: a substrate; a ground layer disposed on one of two opposing surfaces of the substrate; a transmission line disposed on the other of the two opposing surfaces of the substrate; a pad which is disposed on the other of the two opposing surfaces and connected to the transmission line; and a connector connected to the pad via a contact point, wherein the pad has a part on the transmission line side and a part positioned on the opposite side of the transmission line with respect to the contact point with the connector which are electrically insulated from each other.

According to another aspect of the present invention, there is provided a method of manufacturing a substrate device including the steps of: forming a ground layer on one of two opposing surfaces of a substrate and a transmission line and pad connected to the transmission line on the other of the substrate; and connecting a connector to the pad via a contact point, wherein the step of forming the pad forms the pad such that a part on the transmission line side and a part positioned on the opposite side of the transmission line with respect to the contact point with, the connector are electrically insulated from each other.

According to the present invention, the pad is formed such that the part of the pad on the transmission line side and part of the pad on the opposite side of the transmission line are electrically insulated from each other. Thus, it is possible to reduce refection noise from the stub end to reduce degradation of a signal waveform. Further, it is possible to reduce an unnecessary capacitance between the stub and ground layer to thereby improve impedance mismatch.

DETAILED DESCRIPTION OF THE EXEMPLARY EMBODIMENTS

Figure 1:
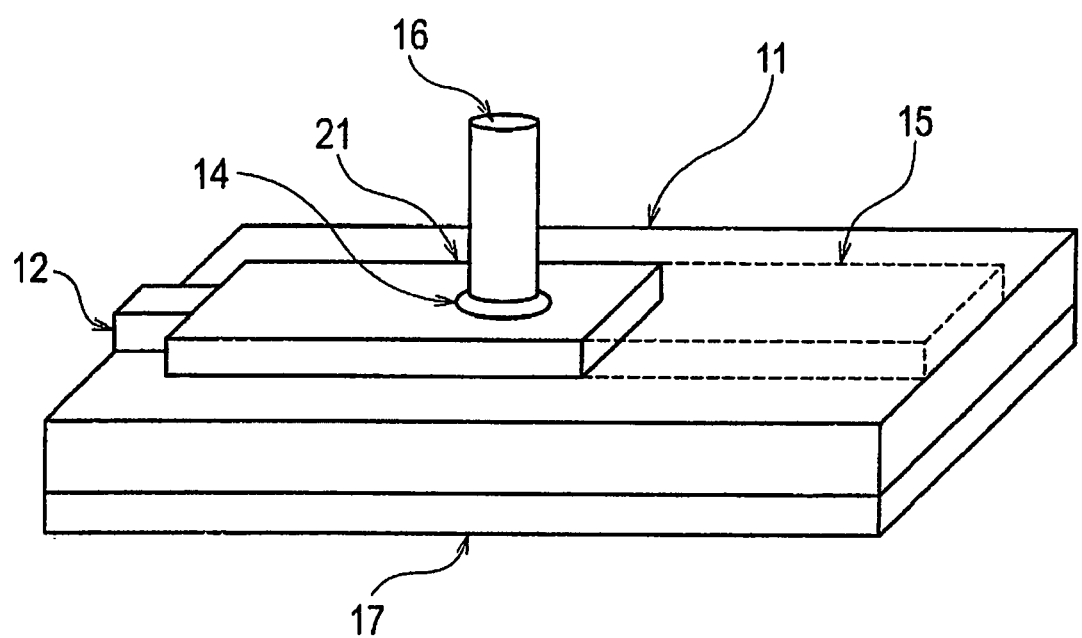
{FIG. 1} A perspective view illustrating a configuration of a substrate device according to an exemplary embodiment of the present invention.

An exemplary embodiment of a substrate device according to the present invention will be described in detail below with reference to the accompanying drawings. Through the following description, the same reference numerals as those in FIG. 8 denote the same or corresponding parts as those in FIG. 8.

FIG. 1 is a substrate device according to an exemplary embodiment of the present invention. In the substrate device illustrated in FIG. 1, a transmission line 12 serving as a signal line is mounted on a printed board 11. The transmission line 12 is connected to a pad 21 for an edge connector 16 at the end of the board. The pad 21 and edge connector 16 are connected to each other at a contact point 14. A transmission signal is transmitted from the transmission line 12 to the edge connector 16 via the pad 21 and contact point 14, or transmitted in the reverse direction from the edge connector 16 to the transmission line 12 via the contact point 14 and pad 21.

As described above, the part of the pad 21 that is positioned on the opposite side of the transmission line 12 with respect to the contact point 14 is fundamentally unnecessary for signal transmission and is called "stub" (stub 15). It is known that, in high-speed signal transmission, the stub 15 serves as a source of reflection noise, which may degrades signal quality. Further, the stub 15 is coupled to a ground layer 17 positioned at the lower layer of the printed board 11 to have capacitance. This may cause impedance mismatch, leading to reflection noise.

In the pad 21 according to the present exemplary embodiment, a part corresponding to the stub 15 is removed. In the pad 21 for the edge connector 16 on the printed board 11, by removing the stub 15 positioned on the opposite side of the transmission line 12 with respect to the contact point 14, reflection noise is suppressed to reduce degradation of a signal waveform. Further, by removing the stub 15 itself, a parasitic capacitance between the stub 15 and ground layer 17 is eliminated to thereby improve the impedance mismatch.

Next, operation of the present exemplary embodiment will be described with reference to FIGS. 2 to 4. A description will be made in comparison with the related art illustrated in FIG. 8.

Figure 2:
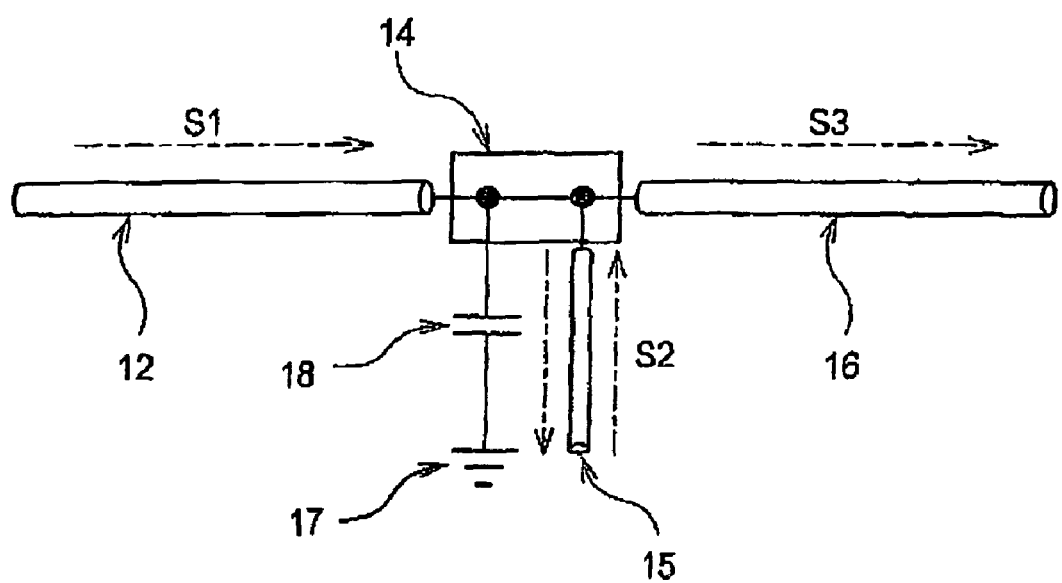
{FIG. 2} A view for explaining operation in the configuration of FIG. 1 in the case where a stub portion is not removed.
Figure 8:
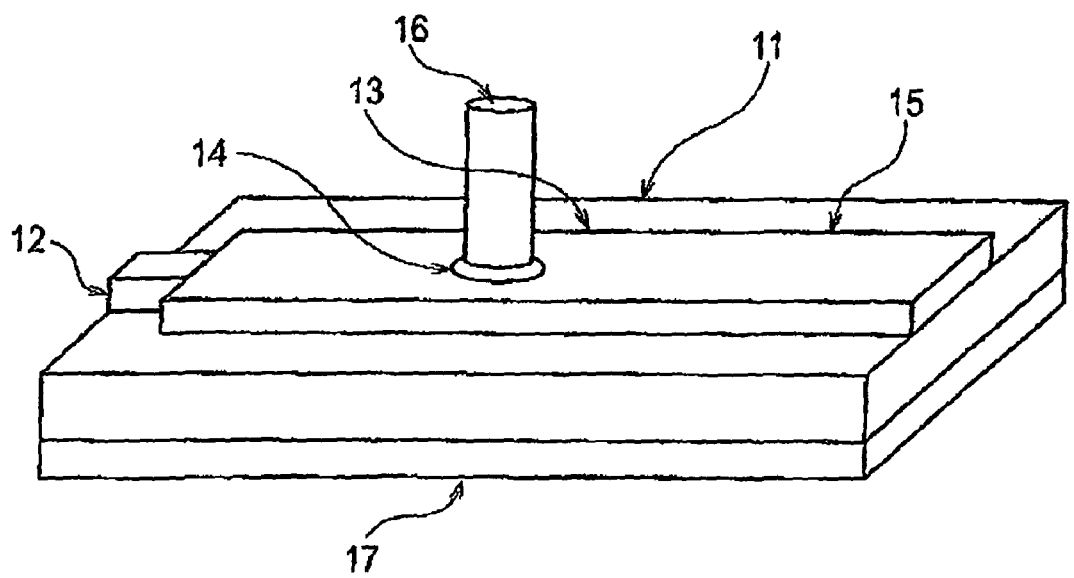
{FIG. 8} A perspective view illustrating a connection configuration of a substrate device according to a related art.

FIG. 2 is a view corresponding to the related art of FIG. 8, which schematically illustrates the flow of a signal. A signal passes through the transmission line 12 and flows in the edge connector 16 from the contact point 14 where a capacitance (parasitic capacitance) 18 between the stub 15 and ground layer 17 is added to the signal.

As illustrated in FIG. 2, a transmission signal S1 passes through the transmission line 12 and reaches the contact point 14 where the transmission signal S1 is branched off into the edge connector 16 and stub 15. Essentially, it is preferable that a current flows only in the edge connector 16. In this case, however, the current flows also in the stub 15. The current flowing into the stub 15 is then reflected at its open end to be returned to the contact point 14 as a reflection noise S2. The reflection noise S2 is propagated into the edge connector 16, and the original transmission signal S1 is superimposed by the reflection noise S2 to be superimposition signal S3. That is, the original transmission signal S1 is disturbed, leading to degradation of a signal waveform.

Figure 3:
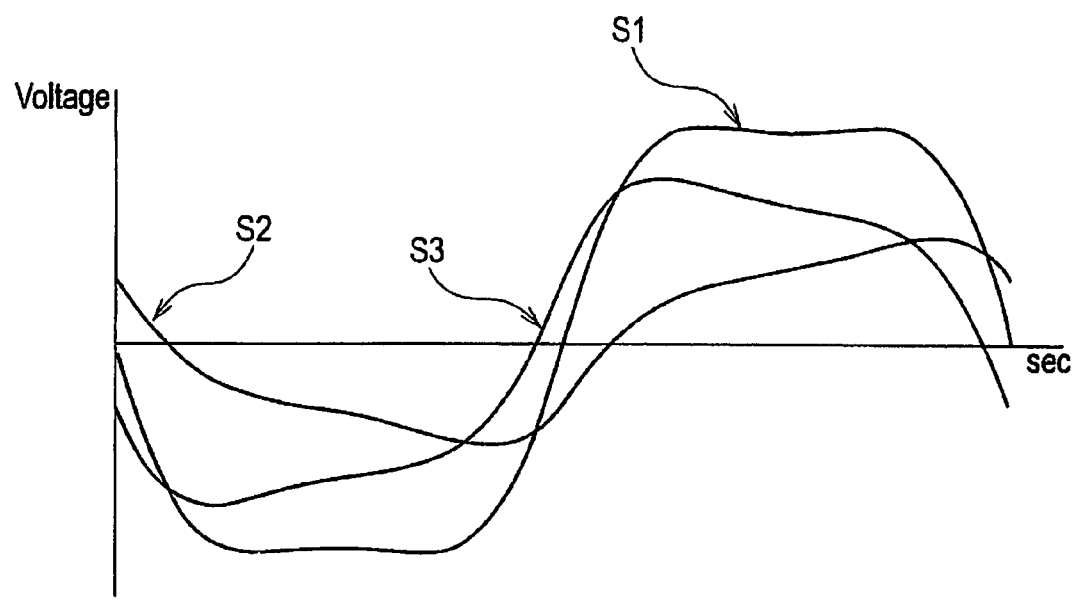
{FIG. 3} A graph illustrating waveforms of an original transmission signal, reflection noise, and superimposition signal in the operation of FIG. 2.

FIG. 3 schematically illustrates waveforms of the original transmission signal S1, reflection noise S2, and superimposition signal S3. The waveform of the original transmission signal S1 is superimposed by the disturbed waveform of voltage profiles with respect to time (sec) of the reflection noise S2 reflected in the stub 15 at the contact point 14 of FIG. 2 to be degraded as represented by the waveform of the superimposition signal S3. The superimposition signal S3 having the degraded waveform is then transmitted to the edge connector 16 as the transmission destination as shown in FIG. 2.

Figure 4:
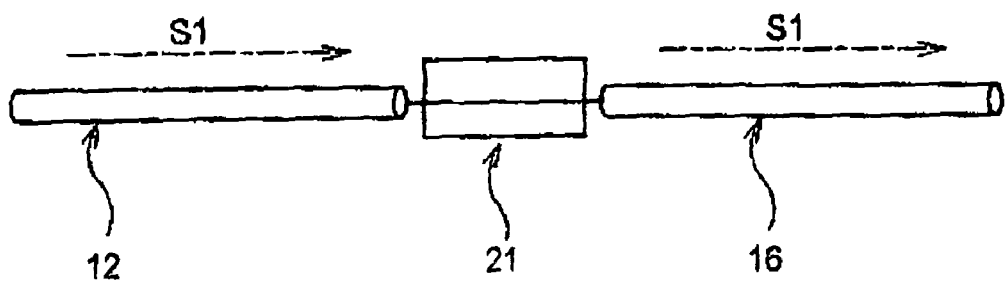
{FIG. 4} A view for explaining operation in the configuration of FIG. 1 in the case where the stub portion has been removed.

FIG. 4 is a view corresponding to the present exemplary embodiment illustrated in FIG. 1. In the present exemplary embodiment, as illustrated in FIG. 4, the stub 15 and capacitance 18 of the related art of FIG. 2 have been removed, so that it is possible to sufficiently reduce the waveform of the reflection noise S2 illustrated in FIG. 3, thereby allowing the transmission line 12 and edge connector 16 to be connected via the pad 21 while keeping the signal quality (signal waveform) of the transmission signal S1.

Impedance Z (Z=Z0) of the transmission line 12 or edge connector 16 of the related art of FIG. 2 is represented by the following expression.

$$Z_0 = \sqrt{\frac{L_0}{C_0}} \qquad \text{\{Numeral 1\}}$$

where L0 is an inductance of the transmission line 12, and C0 is a capacitance value between the transmission line 12 and ground layer 17.

In the case of the related art illustrated in FIG. 2, the capacitance 18 (capacitance value=C1) between the stub 15 and ground layer 17 is added to the signal at the contact point 14, and impedance Z (Z=Z1) is represented by the following expression.

$$Z_1 = \sqrt{\frac{L}{C_0 + C_1}} \qquad \text{\{Numeral 2\}}$$

A relationship between the impedance Z1 of the contact point 14 and impedance Z0 of the transmission line 12 is represented by the following expression.

$$Z_0 \neq Z_1 \qquad \text{\{Numeral 3\}}$$

Thus, impedance mismatch occurs between the impedance Z0 and impedance Z1, causing the reflection noise S2.

On the other hand, in the present exemplary embodiment illustrated in FIG. 4, the stub 15 and capacitance 18 have been removed, so that it is possible to sufficiently reduce the capacitance value C1 of the capacitance 18. Thus, the following relationship is established between the impedance Z0 of the transmission line 12 and impedance Z1 of the contact point 14.

$$Z_0 \approx Z_1 \qquad \text{\{Numeral 4\}}$$

Therefore, it is possible to achieve impedance matching.

According to the present exemplary embodiment shown in FIG. 1, as to the pad 21 for the edge connector 16 positioned at the end of the printed board 11, unnecessary portion (stub 15 in FIG. 8) positioned on the opposite side of the transmission line 12 with respect to the contact point 14 between the pad 21 and connector 16 is removed, which reduces the reflection noise S2 more than in the case of the connection configuration of the related art using the pad 13 in FIG. 8.

Further, according to the present exemplary embodiment, the stub 15 and the corresponding unnecessary capacitance component are removed to reduce impedance mismatch due to the capacitance component. This allows the transmission line 12 and edge connector 16 to be connected while keeping the signal quality, thereby improving the quality of a signal in a high-speed transmission environment.

As described above, according to the present exemplary embodiment, the following effects can be obtained.

The first effect is that the removal of the stub 15 suppresses the reflection noise from the end of the stub 15 to thereby reduce degradation of a signal waveform.

The second effect is that the unnecessary capacitance 18 between the stub 15 and ground layer 17 can sufficiently be reduced to thereby achieve impedance matching.

Further, according to the present exemplary embodiment, the pad 21 is formed on the front surface of the printed board 11, so that the stub 15 can be removed without use of a method using mechanical drilling like JP-A-2008-046142 (the part corresponding to the stub 15 can be formed by an electrically insulating material, or a slit portion may be provided between the pad 21 and stub 15, as described later). Therefore, degradation of reliability of connection between the pad 21 and contact point 14 does not occur.

In the above exemplary embodiment, the following approaches can be exemplified as a process of removing the part of the pad 21 that corresponds to the stub 15: 1) mechanically drilling the part corresponding to the stub 15; 2) dissolving the part corresponding to the stub 15 with chemicals; and 3) omitting a formation step of the part corresponding to the stub 15 in the manufacturing stage.

That is, it is only necessary in the formation process of the pad 21 that the part corresponding to the stub 15 on the opposite side of the transmission line 12 with respect to the contact point 14 with the edge connector 16 is not formed but only the part on the transmission line 12 side is formed. For example, a process of forming only the part of the pad 21 on the transmission line 12 side may include, like the above approach 1) or 2), a step of integrally forming the part on the transmission line 12 side and its opposite side part corresponding to the stub 15 and a subsequent step of removing only the part corresponding to the stub 15.

Further, although the pad 21 does not include the part corresponding to the stub 15 on the opposite side of the transmission line 12 with respect to the contact point with the edge connector 16 but only includes the part on the transmission line 12 side in the above exemplary embodiment, the present invention is not necessarily limited to this, but any configuration may be employed as long as the part of the pad 21 on the transmission line 12 side and part corresponding to the stub 15 are electrically insulated from each other.

Figure 5:
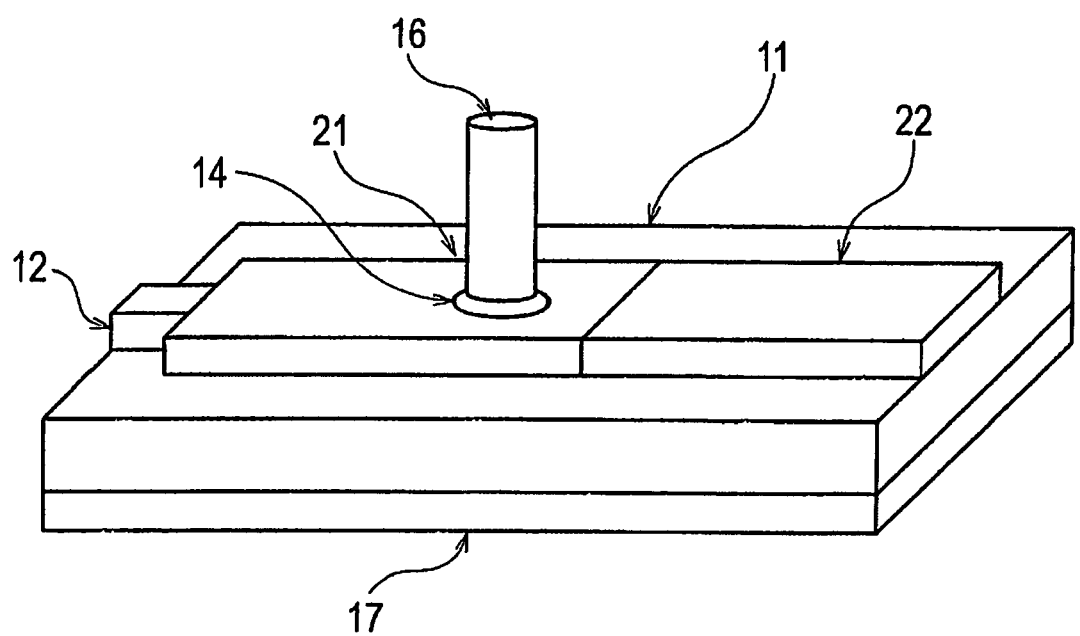
{FIG. 5} A perspective view of a substrate device according to another exemplary embodiment in which the stub part is made of an electrically insulating material.

For example, since it is only necessary for the part of the pad 21 corresponding to the stub 15 to be electrically opened, a configuration may be employed as another exemplary embodiment in which the part corresponding to the stub 15 is made of an electrically insulating material (e.g., insulator) 22 as shown in FIG. 5 in place of removing the part corresponding to the stub 15 in FIG. 8.

In this case, it is only necessary for a process of forming the pad 21 to include a step of forming the part corresponding to the stub 15 on the opposite side of the transmission line 12 with respect to the contact point 14 with the edge connector 16 using the electrically insulating material 22.

Even when the part corresponding to the stub 15 on the opposite side of the transmission line 12 is formed using the electrically insulating material 22, the same effects as those in the above exemplary embodiment can be obtained.

Figure 6:
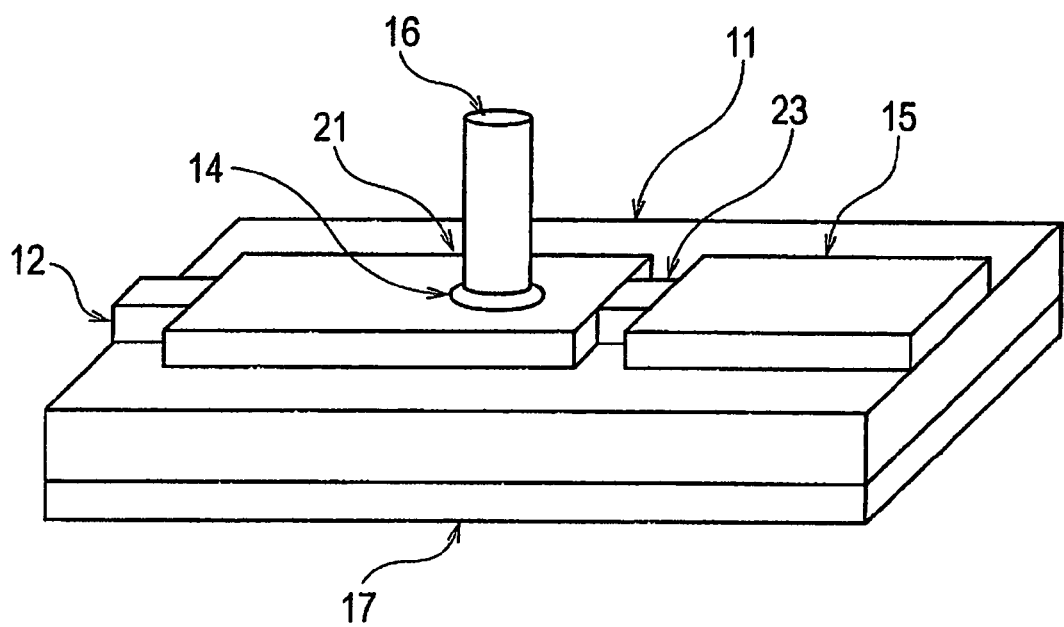
{FIG. 6} A perspective view of a substrate device according to still another exemplary embodiment of the present invention in which a slit portion is provided.
Figure 7:
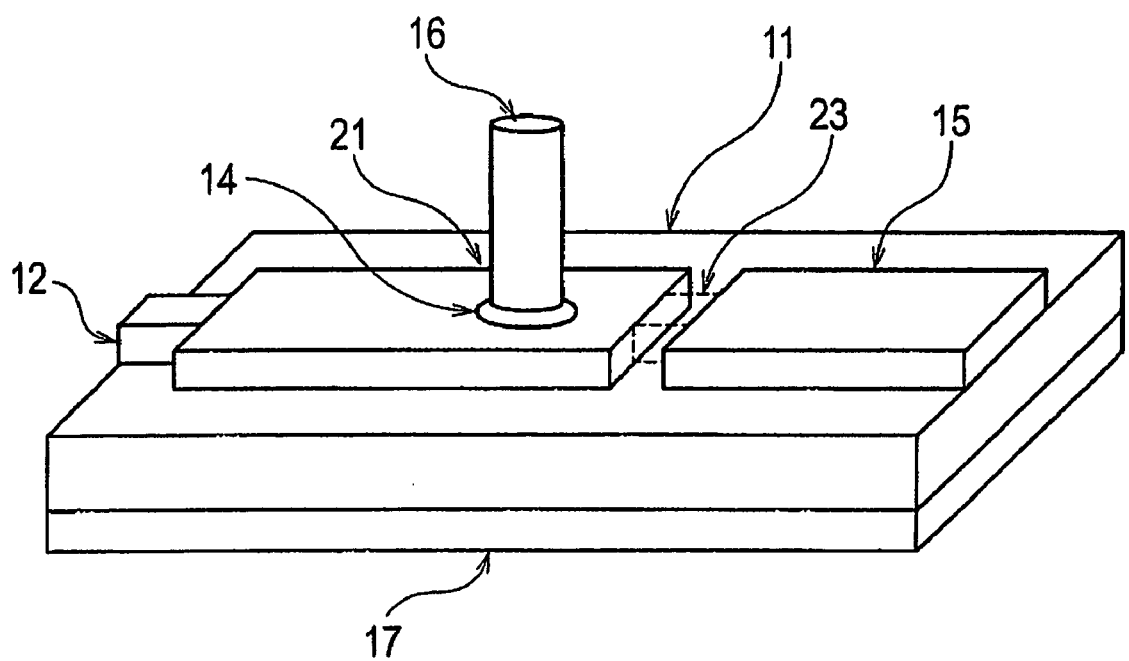
{FIG. 7} Another perspective view of the substrate device of FIG. 6 in which the slit portion is provided.

Further, a configuration may be employed as still another exemplary embodiment in which the entire part corresponding to the stub 15 is not removed but a slit portion 23 is provided between the stub 15 and pad 21 as illustrated in FIGS. 6 and 7 and only the slit portion 23 is subjected to drilling so as to allow the stub 15 and pad 21 to be electrically insulated by the removed portion of the slit portion 23.

In this case, it is only necessary for a process of forming the pad 21 to include a step of providing the slit 23 between the part on the transmission line 12 side and part corresponding to the stub 15 on the opposite side of the transmission line 12 with respect to the contact point 14 with the edge connector 16.

Even when the slit 23 is provided between the part on the transmission line 12 side and part corresponding to the stub 15 on its opposite side, the same effects as those in the above exemplary embodiment can be obtained.

Although the printed board 11 is used as a substrate in the above exemplary embodiment, the present invention is not necessarily limited to this, but other circuit boards used in a transmission line may be employed.

While the invention has been particularly shown and described with reference to the examples thereof, the invention is not limited to these examples. It will be understood by those of ordinary skill in the art that various changes in form and details may be made therein without departing from the spirit and scope of the present invention as defined by the claims.

The present invention may be applied to a substrate device and its manufacturing method. In particular, the present invention may suitably be applied to a substrate device having a pad structure for an edge connector provided at the end of a printed board and a manufacturing method of such a substrate device.

This application is based upon and claims the benefit of priority from prior Japanese Patent Application No. 2008-275509, filed Oct. 27, 2008, the entire contents of which are incorporated herein.

The invention claimed is:

1. A substrate device, comprising:
   a substrate;
   a ground layer disposed on one of two opposing surfaces of the substrate;
   a transmission line disposed on an other of the two opposing surfaces of the substrate;
   a pad which is disposed on the other of the two opposing surfaces of the substrate and connected to the transmission line; and
   a connector connected to the pad via a contact point,
   wherein the pad comprises:
      a part on a transmission line side, placed adjacent to the transmission line with respect to the contact point with the connector; and
      a part positioned on a side opposite to the transmission line side with respect to the contact point with the connector, and
   wherein the part of the pad that is positioned on the side opposite to the transmission line side comprises an electrically insulating material.

2. The substrate device according to claim 1, wherein the substrate comprises a printed circuit board.

3. A method of manufacturing a substrate device, said method comprising:
   forming a ground layer on one of two opposing surfaces of a substrate and forming a transmission line and a pad connected to the transmission line on an other of the two opposing surfaces of the substrate; and connecting a connector to the pad via a contact point,
wherein the forming of the pad comprises:
- forming a part on the transmission line side, adjacent to the transmission line with respect to the contact point with the connector;
- forming a part positioned on a side opposite to the transmission line side with respect to the contact point with the connector; and
- removing the part positioned on the side opposite to the transmission line side, and wherein the forming of the pad comprises:
- integrally forming the part on the transmission line side and the part positioned on the side opposite to the transmission line side; and
- removing only the part positioned on the side opposite to the transmission line side.

4. A method of manufacturing a substrate device, said method comprising:

forming a ground layer on one of two opposing surfaces of a substrate and forming a transmission line and a pad connected to the transmission line on an other of the two opposing surfaces of the substrate; and connecting a connector to the pad via a contact point,
wherein the forming of the pad comprises:
- forming a part on the transmission line side, adjacent to the transmission line with respect to the contact point with the connector; and
- forming a part positioned on a side opposite to the transmission line side with respect to the contact point with the connector, and wherein the forming of the pad forms the part of the pad that is positioned on the side opposite to the transmission line side using an electrically insulating material.

* * * * *